(12) United States Patent
Su

(10) Patent No.: US 12,086,615 B2
(45) Date of Patent: Sep. 10, 2024

(54) SERIAL NAND FLASH WITH XIP CAPABILITY

(71) Applicant: Macronix International Co., Ltd., Hsinchu (TW)

(72) Inventor: Chun-Lien Su, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 18/297,146

(22) Filed: Apr. 7, 2023

(65) Prior Publication Data

US 2023/0244500 A1    Aug. 3, 2023

Related U.S. Application Data

(62) Division of application No. 17/180,004, filed on Feb. 19, 2021, now Pat. No. 11,640,308.

(51) Int. Cl.
| | |
|---|---|
| G06F 9/445 | (2018.01) |
| G06F 3/06 | (2006.01) |
| G06F 9/4401 | (2018.01) |
| G06F 11/10 | (2006.01) |
| G06F 12/0868 | (2016.01) |
| G06F 13/16 | (2006.01) |
| G06F 13/42 | (2006.01) |
| G11C 16/04 | (2006.01) |

(Continued)

(52) U.S. Cl.
CPC ........ G06F 9/44573 (2013.01); G06F 3/0604 (2013.01); G06F 3/0659 (2013.01); G06F 3/0679 (2013.01); G06F 9/4403 (2013.01); G06F 11/1068 (2013.01); G06F 12/0868 (2013.01); G06F 13/1668 (2013.01); G06F 13/4282 (2013.01); G11C 16/0483 (2013.01); G11C 16/26 (2013.01); G11C 16/32 (2013.01); G06F 2212/60 (2013.01)

(58) Field of Classification Search
CPC . G06F 9/44573; G06F 3/0659; G06F 13/4282
See application file for complete search history.

(56) References Cited

U.S. PATENT DOCUMENTS

| | | | |
|---|---|---|---|
| 5,603,011 A | | 2/1997 | Piazza |
| 10,127,156 B1 * | | 11/2018 | Yan ...................... G06F 3/0647 |
| 10,620,850 B1 * | | 4/2020 | Xu ..................... G06F 12/0893 |

(Continued)

FOREIGN PATENT DOCUMENTS

| | | | |
|---|---|---|---|
| CN | 1484129 A | | 3/2004 |
| CN | 1655633 A | | 8/2005 |

(Continued)

OTHER PUBLICATIONS

Wang Xiaochun, State Intellectual Property Office, Notice of First Examination Opinion issued on Mar. 25, 2024, including English translation, 18 pages.

*Primary Examiner* — David E Martinez
(74) *Attorney, Agent, or Firm* — Fish & Richardson P.C.

(57) ABSTRACT

Based on power on of an electronic device, a location of first data in a NAND flash memory of an electronic device is determined. The first data is transmitted to a shadow RAM of the electronic device, outputting the first data is output from the shadow RAM to a host device of the electronic device through a serial peripheral interface (SPI) when accessing the location of the first data in the NAND Flash memory.

15 Claims, 5 Drawing Sheets

(51) Int. Cl.
*G11C 16/26* (2006.01)
*G11C 16/32* (2006.01)

(56) References Cited

U.S. PATENT DOCUMENTS

| | | | |
|---|---|---|---|
| 2005/0204091 A1* | 9/2005 | Kilbuck | G11C 7/10 |
| | | | 711/103 |
| 2007/0233955 A1 | 10/2007 | Luo et al. | |
| 2009/0235125 A1 | 9/2009 | Lai | |
| 2016/0034346 A1* | 2/2016 | Michael | H03M 13/13 |
| | | | 714/755 |
| 2017/0110196 A1 | 4/2017 | Jigour et al. | |

FOREIGN PATENT DOCUMENTS

| | | | |
|---|---|---|---|
| CN | 101421701 | | 4/2009 |
| CN | 107870775 | | 4/2018 |
| CN | 111684406 A | | 9/2020 |
| GB | 2404748 | | 2/2005 |
| GB | 2404748 A | | 9/2005 |
| GB | 2460636 | | 12/2009 |
| TW | 201833927 | | 9/2018 |
| WO | WO-2005013125 A1 * | 2/2005 | ......... G06F 12/0638 |
| WO | WO 2008/001363 | | 1/2008 |

* cited by examiner

SERIAL NAND FLASH WITH XIP CAPABILITY

CROSS-REFERENCE TO RELATED APPLICATIONS

This application is a divisional application of and claims the benefit of priority under 35 U.S.C. § 121 to U.S. application Ser. No. 17/180,004, filed on Feb. 19, 2021, the entire content of which is hereby incorporated by reference.

TECHNICAL FIELD

This disclosure relates in general to integrated circuits and their operations.

BACKGROUND

NOR Flash memory architecture provides enough address lines to map an overall memory range, thus provides advantages of random access and short read times, and is ideal for program execution. NAND Flash memory, in the contrary, has a smaller cell size, higher memory density, and higher write and erase speeds. Compared to the NOR flash memory, however, the NAND flash memory has a slower read speed and does not allow a direct random access. The code execution, particularly accessing the code for proceeding in NAND flash memory is slower than that in NOR flash memory. With the ability of random access, NOR flash memory can proceed programs in eXecute in Place (XiP) mode. In contrast, NAND flash memory does not provide a direct random access and therefore does not have XiP capability. Additionally, the NAND flash memory typically has a possibility of bad bits, when transmitted and requires an error correcting code (ECC) functionality incorporated in data reading operations.

SUMMARY

A method includes determining, based on power on of an electronic device, a location of first data in a NAND flash memory of an electronic device, transmitting the first data to a shadow RAM of the electronic device, and outputting the first data from the shadow RAM to a host device of the electronic device through a serial peripheral interface (SPI) when accessing the location of the first data in the NAND Flash memory.

Implementations may include one or more of the following features.

The first data may be a bootloader code. The first data in the shadow RAM may randomly accessible. The first data may be an executable program executed by the host device and after a system boot of the electronic device starts, and instructions in the first data may be fetched in an eXecution in Place (XiP) mode from the shadow RAM. The electronic device may provide a command to map the shadow RAM to different locations other than the first data after system boots up.

Based on the instructions, second data may be transmitted from the NAND flash memory may to a system memory of the electronic device. The transmitted second data may be executed in the system memory. The second data may be an application firmware code. Transmitting of the second data may include accessing a page of the NAND flash memory, reading the second data by random accessing the page of the NAND flash memory at a designated address, transmitting the second data by outputting the second data to a data cache through a page buffer of the NAND flash memory, and transmitting the second data from the data cache to system RAM.

Transmitting of the first data may include accessing a page of the NAND flash memory, reading the first data by random accessing the page of the NAND flash memory at a designated address, transmitting the first data by outputting the first data to a data cache through a page buffer of the NAND flash memory, and transmitting the first data from the data cache to the shadow RAM. Accessing the page of the NAND flash memory may include accessing a plurality of pages of the NAND flash memory. Transmitting of the first data from the data cache to the shadow RAM may include reading the first data temporarily stored in the data cache to an error correcting code (ECC) engine, performing error correction on the first data in the ECC engine, and sending back, based on completing of the error correction, corrected first data to the data cache. The designated address may be stored in a non-volatile register. Determining the first data may include, in response to the power on of an electronic device, automatically executing a flow of operations of the electronic device, wherein the operations includes reading the first data according to designated address set of the first data in the NAND flash memory.

The method may include data reading operations. The data reading operations may include issuing dedicated commands for data reading operations on the shadow RAM and the NAND flash memory, respectively, wherein the electronic device uses a "RD" command for random access and a "PgRD" command for accessing a page of the NAND flash memory. The data reading operations may include issuing a unified command for data reading operations on the shadow RAM and the NAND flash memory, and indicating whether data is valid for transmission during variable waiting periods by an indicator signal. The indicator signal may be a standalone signal or a composite signal. The composite signal may use an existing datastrobe signal, or the datastrobe signal may be driven from a tri-state to a logic low state when the memory is ready for data transmission. A length of the waiting periods may be configurable by controlling the datastrobe signal. The output data may be aligned with the datastrobe signal. The composite signal may use an existing interrupt signal. The data reading operations may include executing data reading commands based on an address that contained in the first data and stored in the shadow RAM. The data reading operations may include verifying, by a control logic of the electronic device, an input address from the host device, and determining by checking a mapping table whether the input address corresponds to data reading operations in the shadow RAM or the NAND flash memory. The mapping table may contains addresses comprising a source location of the NAND flash memory and a destination location of the shadow RAM, and the mapping table may be established at system power on according to non-volatile registers that record a location of the first data resided in the NAND flash memory.

In another aspect, a method includes determining, based on power on of an electronic device, a location of first data in a serial NAND flash memory of the electronic device, accessing a page of the serial NAND flash memory, reading the first data by random accessing the page of the serial NAND flash memory at a designated address, transmitting the first data by outputting the first data to a data cache through a page buffer of the serial NAND flash memory, and transmitting the first data from the data cache to a shadow RAM of the electronic device.

Implementations may include one or more of the following features.

The method may include executing, by a host device after a system boot of the electronic device starts, instructions of the first data in an eXecution in Place (XiP) mode in the shadow RAM by reading operations, and transmitting, based on the executed commands, second data from the serial NAND flash memory to a system RAM of the electronic device. Transferring of the second data may include accessing a page of the serial NAND flash memory, reading the second data by random accessing the page of the serial NAND flash memory at a designated address, transmitting the second data by outputting the second data to a data cache through a page buffer of the serial NAND flash memory, and transmitting the second data from the data cache to the shadow RAM.

In another aspect, a serial NAND flash for performing data transition operations through serial peripheral interface includes a NAND flash memory configured to store data, a non-volatile register configured to record source address for data transition, a shadow RAM connected with the NAND flash memory through a data cache from the NAND flash memory to the shadow RAM, and a control circuit connected with the NAND flash memory and the shadow RAM. The control circuit is configured to determine, based on power on of an electronic device, a location of first data in a NAND flash memory of an electronic device, and transmit the first data to a shadow RAM of the electronic device.

Implementations may include one or more of the following features.

A mapping table may be connected with the control circuit. The mapping table may include a NAND flash memory address of the first data and address information of the shadow RAM, and the control circuit may be configured to verify an input NAND flash memory address sent from a host device of an electronic system, determine whether the input address corresponds to the NAND flash memory address of the first data, and based on the determination redirect data reading operations in the shadow RAM or read the NAND flash memory. A data cache may be connected with the NAND flash memory and the shadow RAM. The data cache may be configured to temporarily store data output from the NAND flash memory. An error correcting code (ECC) engine may be connected with the shadow RAM and the data cache. The ECC engine may be configured to read the first data temporarily stored in the data cache, perform error correction on the first data in the ECC engine, and send, based on completing of the error correction, corrected first data back to the data cache. A serial peripheral interface (SPI) bus may include data I/O lines, a clock signal line, and chip select signal lines for communications between a host device and rest components in the electronic device. Whether data is valid for transmission during variable waiting periods may be indicated by indicator signal. The indicator signal may be a standalone signal or a composite signal. The composite signal may be an existing datastrobe (DS) signal or a DS signal being driven from a tri-state to a logic low state when the memory is ready for data transmission. A length of the waiting periods may be configurable by controlling the DS signal. The output data may be aligned with the DS signal. The composite indicator may be an existing interrupt signal.

The details of one or more embodiments are set forth in the accompanying drawings and the description below. Other aspects, features and advantages will be apparent from the description, the drawings, and the claims.

BRIEF DESCRIPTION OF THE DRAWINGS

Like reference numbers and designations in the various drawings indicate like elements. It is also to be understood that the various exemplary implementations shown in the figures are merely illustrative representations and are not necessarily drawn to scale.

DETAILED DESCRIPTION

This application describes an electronic device with NAND Flash with XiP capability. Specifically, the electronic device includes a host device that transmits data from and to the NAND Flash in serial. The NAND flash device includes NAND flash memory that has serial or parallel interface and high memory density for data storage. In order to improve the response time of the electronic device and provide random access for data reading operations in the XiP mode, the electronic device is configured to mirror data stored in the NAND flash memory to a shadow RAM. In particular, the electronic device automatically transfers an executable program, e.g., a bootloader, from the NAND flash memory to the shadow RAM when the electronic device is powered on. The transfer is initialized by determining an address range of the executable program, e.g., the bootloader, stored in the NAND flash memory array. And then the electronic device transfers the executable program by accessing one or more pages of the NAND flash memory and accessing the executable program data on each of the one or more pages. The data packages, e.g., one or more bytes, of the executable program are temporarily stored in a data cache for data error correction by an ECC engine of the electronic device. The executable program transmission continues until the data reading is completed on a last page of the NAND flash memory that stores the executable program.

For application firmware stored in the electronic device, the electronic device may read out the executable program, e.g., the bootloader, for execution in the XiP mode from the shadow RAM. The executable program may include operation commands, e.g., data reading operations, and address range information of an application firmware stored in the NAND flash memory. By executing a bootloader program in XiP mode, the electronic device can output the application firmware from the NAND flash memory to a system memory for further operations including executing the application directly from the system memory.

Figure 1:
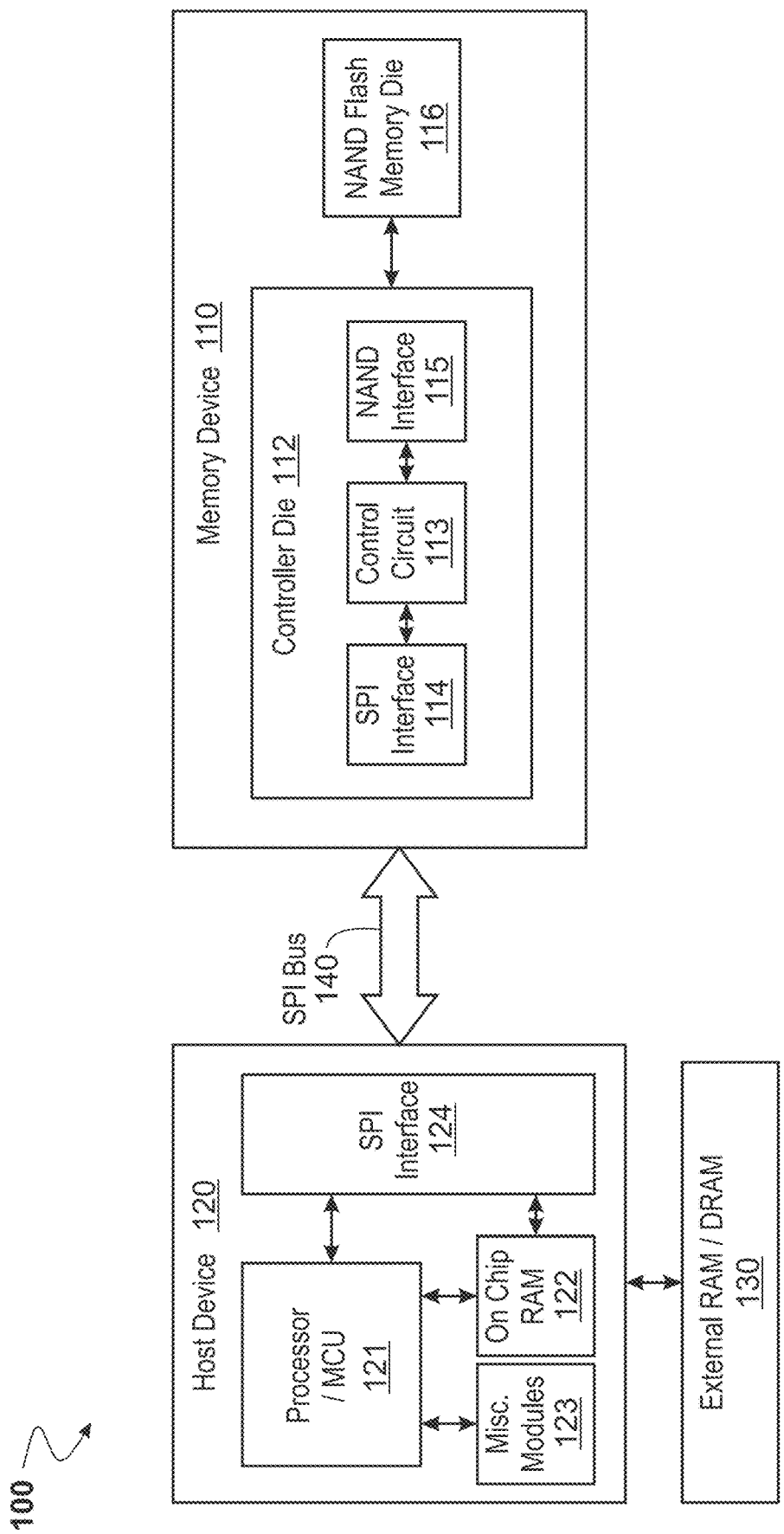
FIG. 1 illustrates an example of an electronic device system 100.

FIG. 1 illustrates an example of an electronic device system 100 that includes a host device 120, a memory device 110, and an external memory 130. The host device 120 includes processor 121 configured to perform operations of the host device 120 and an on-chip memory, e.g., on-chip RAM 122 configured to store data or instructions. The on chip RAM 122 is connected with the processor 121 to transfer data to and from the processor 121. Additionally, the host device 120 also includes a plurality of input pins (not shown) contained in a Serial Peripheral Interface (SPI) 124 through which the host device 120 sends or receives instructions or data to the memory device 110. The host device also includes miscellaneous modules 123 connected to the processor 121. In this example, the host device 120 transfers received data to the external memory 130 that is embedded in the electronic device system 100 and connected with the host device 120. In this example, the external memory 130 is a random access memory (RAM) that stores instructions and data used by the host device 120. The external memory 130 may be a dynamic random-access memory (DRAM) to store instructions and data. The SPI bus 140, as shown in FIG. 1, connects the host device 120 and device 110 for communications. Generally the SPI bus 140 connects electronic devices in a full duplex mode using a mater-slave architecture with a single master. In some implementation, the SPI bus is enhanced to support multiple I/O and becomes Expanded SPI (xSPI) defined in JEDEC Solid State Technology Association.

The device 110 includes a device controller 112, which can be on a first die, and a NAND flash memory 116, which can be on a separate second die. The device controller 112 includes a control circuit 113, a SPI interface 114 and a NAND flash interface 115. In some implementations, the system 100 may include one or more memory devices 110 that are connected with the host device 120. Here, the NAND flash memory 116 may be an array of NAND flash memory that arranged in sequence of pages The device controller 112 is connected with the NAND flash memory 116 and configured to read data from or write data to the NAND flash memory 116. As shown in FIG. 1, the controller 112 is configured to transfer data in serial through the SPI interface 114 and SPI bus 140.

In some implementations, the device 110 is a memory device. In some implementations, the device 110 is a slave device that is selected by a master device, for example, the host device 120.

In some implementations, the host device 120 is a master device and the memory device 110 is a slave device. The electronic device system 100 has a single master—multiple slave bus topology with the SPI bus 140 communicating the master device 120 and the slave device 110.

The device controller 112 includes a control circuit 113 which can be one of a state machine based controller, an application-specific microcontroller, or an general purpose microprocessor. Here, the controller 112 controls the data reading and writing operations on the NAND flash memory 116. In this example, the memory device 110 includes two different dies, e.g., the controller die 112 and the NAND flash memory die 116. In some other implementations, the controller 112 and the NAND Flash memory 116 are integrated in a same die, e.g., the memory device 110 is fabricated monolithically.

In this example, the processor 121 is configured to execute instructions and process data from memory device 110 through the SPI bus 140. In some implementations, the processor 121 is a general-purpose microprocessor, or an application-specific microcontroller. The processor 121 is also referred to as a central processing unit (CPU).

The processor 121 also accesses instructions and data from the on chip RAM 122. For example, after the processor 121 executes the executable program in the memory device 110 in an XiP mode, other instructions and process data, e.g., application firmware, can be transferred to the on-chip RAM 122 from the memory device 110 through the SPI bus 140, and the processor 121 can then execute the instructions from the on-chip RAM 122.

In some implementations, the external memory 130 is a cache memory that is connected with the memory device 110 through the host device 120, as shown in FIG. 1. The external memory 130 stores instruction codes, which correspond to the instructions executed by the processor 121, from the memory device 110, and/or the data that are requested by the processor 121 during runtime.

The device controller die 112 transfers the instruction code and/or the data from the NAND flash memory die 116 to the external memory 130. In this example, the NAND flash memory die 116 is a non-volatile memory that is configured for long-term storage of instructions and/or data, e.g., a serial NAND or a parallel NAND flash memory device. In implementations where the memory 116 is an NAND flash memory, the memory device 110 is an NOR Flash emulation to provide similar NOR Flash features by managing the connected NAND Flash like error correction, shadowing, bad block replacement or skipping, and so on.

A SPI bus, e.g., the SPI bus 124 shown in FIG. 1, is a typical interface for accessing the NAND flash memory in the device 110. When incorporated into an embedded system, for example, a MCU, the serial NAND flash memory may require fewer wire connection on the PCB of the electronic device system 100 as compared to that of a parallel NAND flash memory, as it transmits data one bit per clock cycle. The implementation of the serial NAND flash memory brings benefits of less board space, low power consumption and a total system cost reduction for the electronic device system 100.

In this example, the NAND flash memory 116 may be a parallel NAND flash memory, e.g., a 2 Gb single level cell (SLC) NAND flash memory with a parallel interface. The flash memory device 110 converts parallel data from the NAND Flash memory 116 to a serial format for output on an SPI interface 114 through the device controller 112. The NAND flash memory may support a 4-wire bus with a page size of 1168+64 byte and a block size of 128K+4K byte. The NAND flash may also support random data read out by x1, x2, x3, or x4 modes with latency of array to register at 25 us and operate at a frequency of 104 MHz. Additionally, the NAND flash may program a page in about 300 us, erase a block in about 1 ms, and be operated at a single voltage from 2.7 V to 3.6V. Furthermore, the NAND flash memory 116 may coordinate with the device controller 112 to support 4-bit ECC and 528-byte operation. Alternatively, the NAND Flash memory can be a serial NAND Flash.

The SPI bus 140, as described earlier, is a serial synchronous communication bus developed for communication and interconnection between the host device 120 and device 110. It supports a single master—multiple slave bus topology with a synchronous clock signal provided by the host device 120 in the electronic device system 100. The SPI bus 124 also supports 24 bit and 32 bit addressing, data reading and writing for DDR devices, and multiple wires interfaces as expanded SPI (xSPI).

In some implementations, the external system memory 130, may be a static random access memory (SRAM), a pseudostatic random access memory (PSRAM), or a dynamic random access memory (DRAM). The external system memory 130 may be located outside of the host device 120. In such a case, the system memory 122 is configured to store the instructions and data transferred from the memory device 110 through the host device 120.

As described earlier, the electronic device system 100 can include multiple devices 110 as slave devices therein and there are different techniques that may be used to increase the number of slave devices in the mode described in FIG. 1. For example, incorporating a multiplexer for generating the chip select signal.

Figure 2:
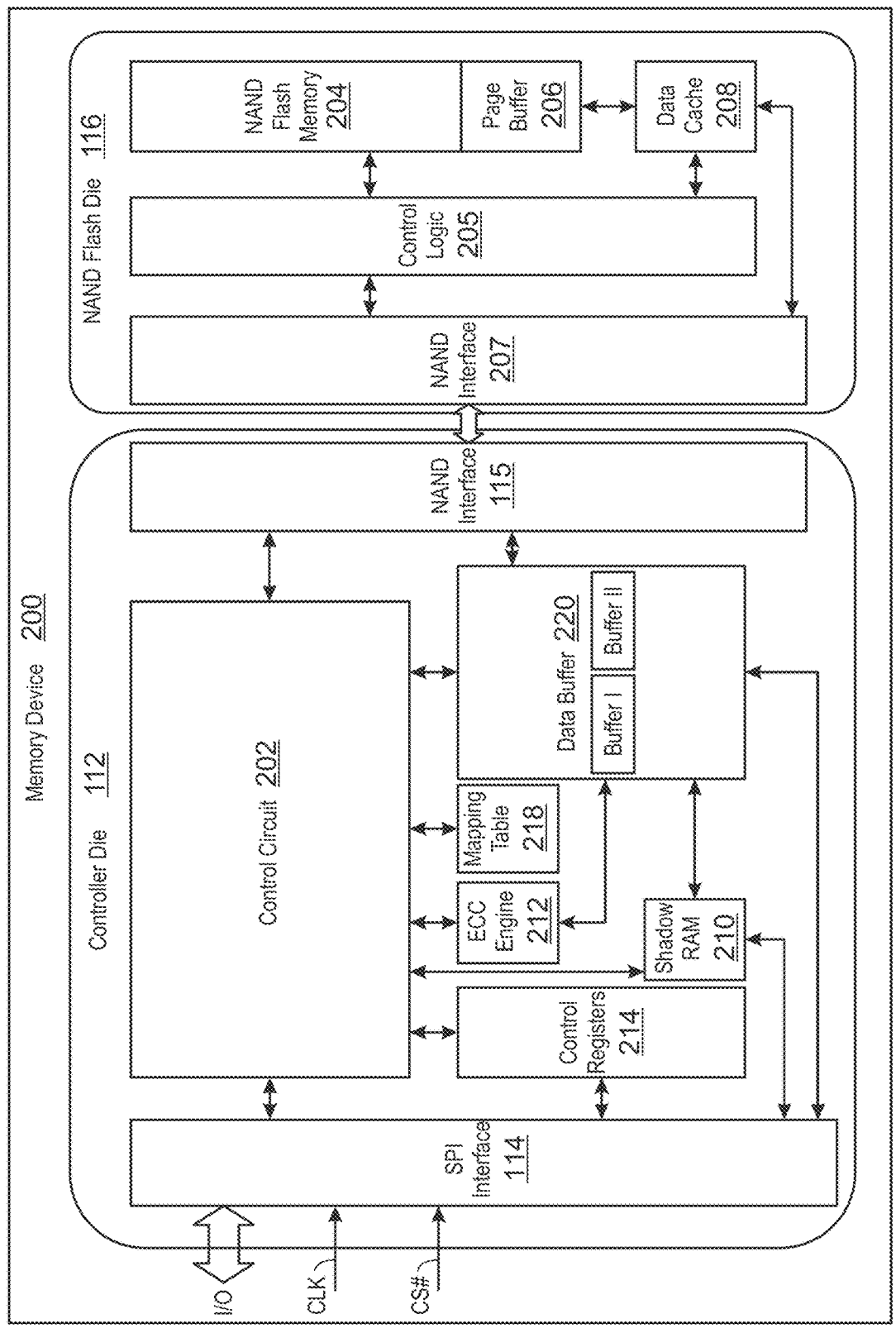
FIG. 2 illustrates a block diagram of an example device 200 that can provide the first device 110 in the electronic device system.

FIG. 2 illustrates a block diagram of an example memory device 200 that can provide the first memory device 110 in the electronic device system 100. Here, the memory device 200 is an integrated monolithic chip for the implementation of memory device 110. The device 200 includes a NAND flash memory 116 and an associated controller 112. In this example, the controller 112 includes circuit blocks such as a control circuit 202, an ECC engine 212, a control register 214, a mapping table 218, a SPI interface 114 and a NAND interface 115. In addition, the controller 112 includes a shadow RAM 210 and a data buffer 220 that are connected with the NAND flash memory 116 through the NAND interface 115.

In this example, the NAND flash 116 includes a NAND flash memory 204 which is a NAND flash array. The NAND flash memory can be directly integrated monolithically in the memory device 200 with other components. The NAND flash memory 116 is connected with a control logic 205 and is operated by the control logic 205 according to the commands sent from the host device 120 through the SPI interface 114, NAND interfaces 115 and 207. As compared to other types of flash memories, e.g., NOR flash, the NAND flash memory 116 has much smaller memory cell size and higher data write and erase speeds. However, NAND flash memory access latency time is usually longer and it is not capable to provide random access for data reading. The content of each page is read sequentially with address and commands at beginning of each data reading cycle. Furthermore, the NAND flash memory 204 is connected with the data cache 208 through a page buffer 206 of the NAND flash memory 204.

In this example, bit lines of the NAND flash memory 204 may be coupled to the page buffer 206. The page buffer 206 may include sense amplifiers and storage elements such as program buffers or latches for each bit line connected, to store data that is written to or read from specific memory cells of the NAND flash memory 204. In general, the page buffer 206 is fabricated in parallel to and has a same layout as that of the NAND flash memory 204. The page buffer 206 is usually located adjacent to memory cells of the NAND flash memory 204 on the device 200. The size of the page buffer 206 is equal to or larger than one page of the NAND flash memory 204.

As shown in FIG. 2, the data cache 208 is coupled to the shadow RAM 210 and the page buffer 206 for temporary data storage. The data transition between the data cache 208 and the shadow RAM 210 goes through the NAND interfaces 115 and 207, and the data buffer 220 located in the controller 112. The data stored in the NAND flash memory 204 may be output through the page buffer 206 and temporarily stored in the data cache 208. Generally, the data cache 208 is a RAM that has a faster access speed compared to the NAND flash memory 204, and is typically physically separated from the NAND flash memory 204. In this example, random address data reading is permitted in data cache 208 and the size of the data cache 208 may be similar to or twice, or even triple of the page buffer 206. In some implementations, the data cache 208 is located inside the NAND flash memory 204.

In this example, the control circuit 202 is operably coupled to the SPI bus 140 through its SPI interface 114 to receive a chip select signal CS #, a clock signal CLK, and instructions and data through the SPI 124. Commands can be input through data I/O lines of the SPI 124 and then transferred to the control logic 202 and the control register 214. The control circuit 202, in combination with the control register 214, interprets commands from host device 122 and executes the corresponding operations such as data read, data erase, or data write operations in the NAND flash memory 204.

As shown in FIG. 2, the control circuit 202 is connected with a mapping table 218 that may be composed by a content addressable memory, a look-up table, or a register bank. The mapping table 218 is configured to map the specific data areas in the NAND Flash memory 204 to the shadow RAM 210 according to the non-volatile registers configured by users in advance. In one implementation, the non-volatile registers reside in a special reserved area of NAND Flash memory 204 and are read out to the control registers 214 when the system 100 is power on.

In this example, the control circuit 202 manages the mapping table 218 and examines any input address in full address bytes for data reading or writing operations either in the shadow RAM 210 or the NAND flash memory 204 according to this mapping table 218. For example, a data reading operation of the memory device 200 includes reading data having a selected address in the mapping table 218. The data reading address is sent from the data I/O lines of the SPI 140 to the control circuit 202. Once the control circuit 202 receives the input data reading address, it verifies the data reading address and if the input address belongs to the range of mirrored area of NAND Flash memory then the control circuit 202 redirects the data reading address to a memory cell address of the shadow RAM 210. Otherwise, i.e., if the input address is not within the mirrored area then the control circuit will just access the NAND flash memory 204.

The shadow RAM 210 provides random access and near-zero latency for data reading operations, and can be accessed like a NOR flash memory or even faster. In this example, the shadow RAM 210 is configured to store data that is transmitted from the NAND flash memory 204 and to mirror the data. The shadow RAM 210 can also store other applications that frequently executed by the system, e.g., interrupt routine operations after the system booting according to further configuration later.

The ECC engine 212 is assigned in memory device 200 to perform the data error connection based on the detected ECC bytes of the read data. As shown in FIG. 2, the ECC engine 212 is coupled to the data cache 208 through the NAND interfaces and the data buffer 220, and configured to detect output data from the NAND flash memory 204 to the shadow RAM 210. The ECC engine 212 calculates the output data for an ECC error in the data reading based on respective ECC bytes transmitted from the data cache 208 through data buffer 220. Furthermore, a control register 214 is coupled with the SPI 114 and the control circuit 202. The control register 214 may be configured to store control parameters according to the commands input via the SPI 140 and to conduct the control logic for responding different commands from the host device 120 and operating the memory device 200.

This memory device 200 can interface with a host system or a host device, e.g., the host device 120 shown in FIG. 1, based on a suitable communication protocol. In this example, the memory device 200 interfaces with a host device (not shown in FIG. 2) using SPI interface 114 for interconnections. The SPI interface 114, as described earlier, includes data I/O lines carrying instructions and data, a CLK line carrying clock signal driven by the host device, and a chip select line carrying a chip select signal to select the memory device 200 for communications between the host device 120 and the memory device 200.

Figure 3:
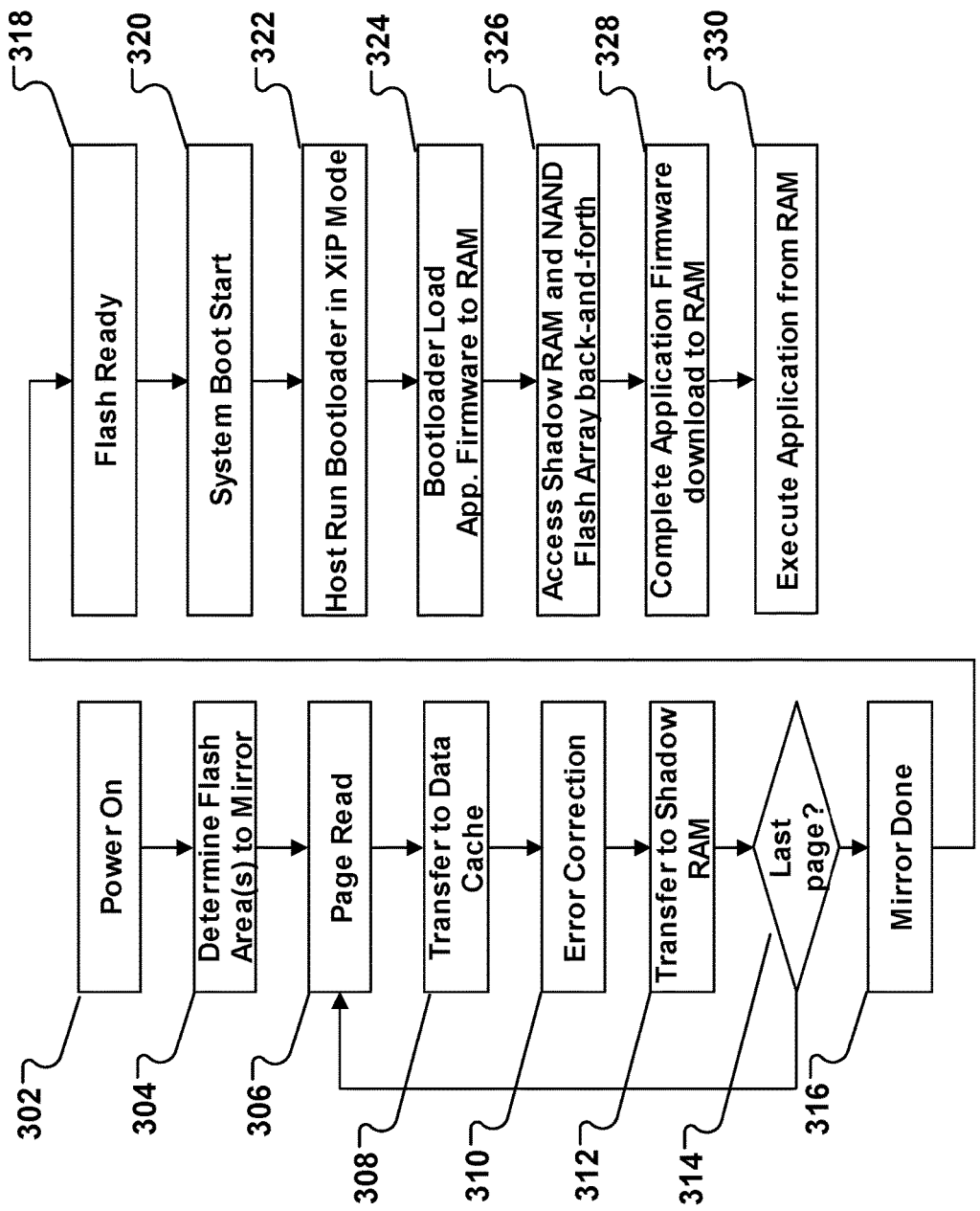
FIG. 3 illustrates a flow chart of an example process 300 with operations processed in the XiP mode.

FIG. 3 illustrates a flow chart of an example process 300 with operations processed in the XiP mode in the system 100. The example process 300 includes two phases. The first phase, as shown from step 302 to step 316, includes mirroring first data from the NAND flash memory to the shadow RAM. The second phase includes steps 318 to 330, to transfer second data from the NAND flash memory to the system RAM by executing the first data in the XiP mode from the shadow RAM.

XiP is a method of executing programs or instructions directly in a long term storage media, e.g., a storage RAM, rather than copying data from other memories to the system RAM for execution. In this example, as shown in FIG. 2, the shadow RAM 210 is provided as a memory to execute programs in the XiP mode during the system initialization, so as to reduce memory access time and improve the system response time.

When the system 100 is powered on (step 302), the control circuit 202 of the memory device 200 automatically transfers/mirrors the first data stored in the NAND flash memory 204 to the shadow RAM 210. The transferring of the first data starts with determining an address range of the first data in the NAND flash memory 204 (step 304). Here, the address of the first data in the NAND flash memory 204 is pre-stored in the mapping table 218 of the controller die 202. In this example, the mapping table 218 is configured according to the content of registers at earlier stage after power on. In some implementations, the mapping table 218 is configured to store user specific mapping information in a reserved NAND Flash area and then dump to registers at system 100 power on in a very earlier stage. In response to the system 100 power on, the device 200 may automatically access the mapping table 218 and determines the data reading address of the first data in the NAND flash memory. The mapping table 218 may include logical block address and corresponding physical block address. When the logical block address sent from the host device 120 is received by the memory device 200, the control circuit 202 converts the logical block address to the physical block address according to the mapping table, where the physical block address is mapped on various memories of the electronic device system 100 including the shadow RAM and the NAND flash memory. The mapping table 218, in this example, needs to be updated so that any logical address corresponding to the transferred first data points to the shadow RAM 210 rather than the NAND flash memory 204, for operations executed in the XiP mode.

Typically, the first data is a small block of code or program, e.g., a bootloader, which can be performed in the XiP mode. The bootloader is implemented with NOR-like SPI NAND flash memory access operation and even a continuous mode if the operation is supported by SPI NAND flash itself. In this example, the bootloader is firstly mirrored from the NAND flash memory 204 to the shadow RAM 210, and then executed by the processor 121 in XiP mode in the shadow RAM 210 so as to transfer the second data, e.g., an application firmware, from the NAND flash memory 204 to the system RAM, e.g., the system memory 122 or the external RAM/DRAM 130. In addition, the bootloader may also include a minimal program to properly set up the system RAM and/or the external RAM/DRAM before accessing.

Referring back to FIG. 3, once the first data reading address is determined, the control circuit 202 starts to access the NAND flash memory 204 to transfer the first data. The transferring of the first data from the NAND flash memory 204 to the shadow RAM 210 is conducted by iterating steps 306 to 314 shown in FIG. 3.

A read operation on the NAND flash memory includes at least two procedures: a page read operation and a random data read operation on the page. The access of a page of the NAND flash memory is usually the bottleneck of the read operation and may take longer than 25 us. Once the physical block address, as a data reading starting address, is mapped according to the mapping table, the control logic accesses a specific page of the NAND flash memory and reads the first data at the starting address (step 306). The designated first data is output from the page of the NAND flash memory and temporarily stored in the data cache through the page buffer (step 308).

As described earlier, a random address data reading is permitted in the data cache 208 and the size of the data cache is similar to or larger than a page of the NAND flash memory. With this configuration, the ECC engine is able to access the data cache in a faster speed compared to that of the NAND flash memory. In this example, the data in the data cache 208 is further transferred to data buffer 220 through NAND interface 115 and 207. When transferring the data from the NAND interface 115 to the data buffer 220, the ECC engine 212 may also fetch the data simultaneously and calculate the correct information immediately after transferring. And then ECC engine can correct errors in the data buffer 220.

In response to the completed error data correction, the control circuit 202 controls the data buffer 220 to output corrected data packages of the first data to the shadow RAM 210 (step 312). In this example, the data packages transmitted between the blocks within the memory device 200 may be an 8-bit word or much wider.

The first data may be stored on a single page of the NAND flash memory. In some implementations, the first data has a larger size and is stored on multiple pages of the NAND flash memory 204. As a result, the control circuit 202 determines whether the current accessed NAND flash memory page is the last page for the data reading operation (step 314). If the conclusion is not, when a last data packages of a current page is transmitted out, a new page accessing command is issued for data reading on the next page of the NAND flash memory. The data reading on the next page of the NAND flash memory repeats the operations from steps 306 to 314 as shown in FIG. 3.

In some implementations, the accessing of the NAND flash memory continuous from an end of the current page to a beginning of a following page on the NAND flash memory. There are waiting periods between accessing various NAND flash memory pages, and NAND Flash die 116 may use multiple page access operations to access multiple pages of the NAND flash memory. In this example, the page access operations are initiated by the control circuit 202 to the NAND Flash die 116 through the NAND Interface 115 and 207. Once a last data packet of the first data is transmitted out of the NAND flash memory and stored in the shadow RAM through the data error correction, the mirroring of the first data is complete (step 316).

When the flash memory is ready (step 318), the system boot of the memory device 200 starts (step 320) to provide a normal execution environment for running programs or applications. For a smaller embedded system, the system boot usually is initialized by loading a kernel into a main memory, e.g., the external memory 130, and starting its execution. The initial system boot program may be stored in a read only memory (ROM) of the electronic device system 100. There may be a second boot program, the bootloader mentioned in step 322, stored in the memory device 200 for other smaller embedded systems. For some embedded system without ROM in the host device 120, the boot program is stored in the memory device 200 as the bootloader mentioned in step 322.

In this example, once the system boot starts, the application data, e.g., application firmware, mirroring starts to transfer application data from the NAND flash memory to the external system memory 130 or the on-chip RAM 122 by executing the first data, which is the bootloader mentioned in step 322, in the shadow RAM in XiP mode (step 322). Here, the host device 120 executes the bootloader program which was originally mirrored from the NAND flash memory and currently stored in the shadow RAM with a capability of random access and a much shorter access time compare to that of the NAND flash memory and even the NOR Flash memory.

Executing the bootloader program in the XiP mode includes issuing data reading commands and sending data reading address in full address byte cycles. In this example, the bootloader program contains the data reading instruction and the data reading address which refers to the second data, e.g., the application firmware that is stored in the NAND flash memory. The processor 121 of the host device fetch the instructions and data from the shadow RAM 210 and issues a reading command with an address for reading out the second data of the NAND Flash memory 204 to the external system memory 130 according to the fetched instructions from the shadow RAM 210. Once the NAND flash memory is ready, data packages of the second data are output through the page buffer 206 and temporarily stored in the data cache 208. Similar to the error correction operation described on step 310, the ECC engine 212 returns corrected data packages back to the data buffer 220 once the data correction is completed. After the data error correction, the data packages of the second data is transmitted in serial from the data buffer 220 and is sent to the external system memory 130 or the on-chip RAM 122 through the SPI bus 140. For second data that is stored on multiple pages of the NAND flash memory 204, the host device 120 uses various commands, e.g., a "PgRD" command and a "RD" command, according to the instructions that stored in the bootloader to access data stored on multiple pages of the NAND flash memory. In addition, the host device 120 accesses the shadow RAM 210 and the NAND flash memory 116 back and forth (step 326) for executing data reading instructions in XiP mode and transmitting the second data.

In another embodiment, the host device 120 may only access the RAM and execute data reading command once, for accessing the NAND flash memory and transmitting the second data out continuously from multiple pages of the NAND flash memory. For example, the memory device 200 is configured to use a unified data reading command, e.g., a "RD" command, to output data from multiple pages of the NAND flash memory without issuing multiple data reading command in the shadow RAM. More details of the configurations and unified instruction setup is provided later on descriptions of FIGS. 4 and 5.

In other implementations, the address byte for accessing the NAND flash memory 204 is provided by the host device 120. The host device 120 sends the address byte for data reading operations to the control circuit 202 of the memory device 200 through the SPI bus 140 and the SPI interface 114. Once the control circuit 202 receives the address data, it verifies the address and when the address is pointed to the program code it performs a redirect to the address of the shadow RAM according to the mapping table 218. The converted address will be sent to the shadow RAM 210 for the program executing in the XiP mode.

The memory device 200 iterates the above mentioned steps 322 to 326 until all the second data, e.g., the application firmware, is transmitted to the external system memory 130 or the on-chip RAM 122 (step 328). In the last step of the process flow shown in FIG. 3, the host device 120 executes the application from the external system memory 130 or the on-chip RAM 122 (step 330), to achieve shorter memory access time and better system performance.

For operations in XiP mode, for example, executing instructions stored in the shadow RAM to perform data reading or writing operations respectively from or to the NAND flash memory, the host device 120 is firstly access the shadow RAM to read operation instructions, and then access the NAND flash memory to transmit data for which the instructions are executed. This configuration provides higher system efficiency as accessing the shadow RAM randomly for operations in XiP mode is much faster compare to accessing other memories in the system, e.g., the NAND flash memory.

Figure 4A:
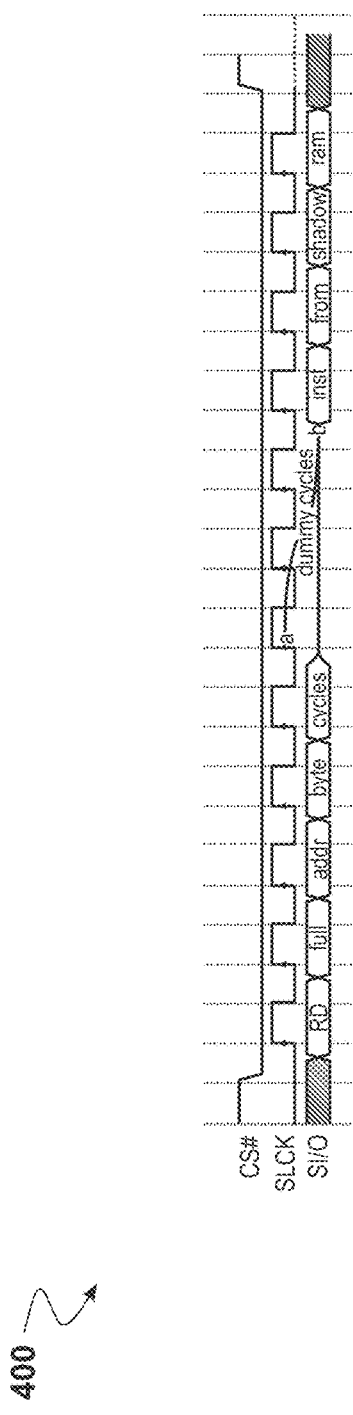
FIG. 4A illustrates timing diagrams of data reading operations in the shadow RAM in one embodiment.
Figure 4B:
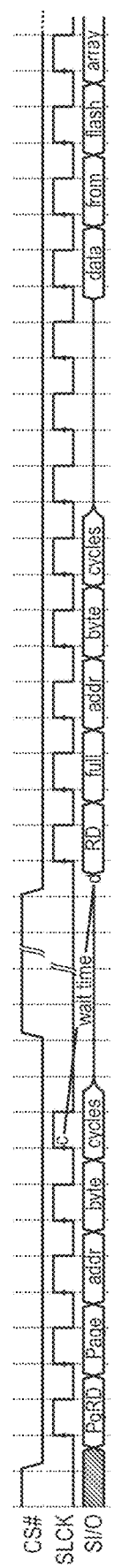
FIG. 4B illustrates timing diagrams of data reading operations in the NAND flash memory in one embodiment.

FIGS. 4A and 4B illustrate timing diagrams of data reading operations in the system 100. The timing diagrams show example waveforms used when reading data from the memory device 200 to a host device, e.g., the host device 120, through SPI bus 140. Specifically, FIGS. 4A and 4B illustrate accessing the shadow RAM for instructions and then accessing the NAND flash memory for data transmission to the system RAM. In this example, the timing diagrams of FIGS. 4A and 4B include three phases for data reading operations including: 1) a command & address phase; 2) dummy cycle phase; and 3) data phase. These three phases are arranged in serial so as to complete the data transmission from the memory device 200 to the host device 120.

As shown in FIG. 4A, the device 200 uses a "RD" command to read instructions from the shadow RAM 210. Alternatively, as shown in FIG. 4B, the device 200 uses a "PgRD" command followed by a "RD" command to read data from a specific page of the NAND flash memory 204. Here, the "RD" command is used to fetch data reading instructions or data from the shadow RAM 210 or a page of the NAND flash memory 116, respectively. The "PgRD" command, different from the "RD" command, is used to access a specific page of the NAND flash memory 204 for the data reading operations. In this example, the instructions are stored in the shadow RAM 210 and the data corresponding the operations in the XiP mode, e.g., an application firmware, is stored in the NAND flash memory 204.

Referring to FIG. 4A, after the chip select signal CS # is issued, the "RD" command and a full address byte, e.g., a 32-bit address, are transmitted into the device 200 using the SI/O pin in the earlier clock cycles. Once the instruction data transmission in the command & address phase is completed, the dummy cycle phase starts for buffering. The dummy cycles, in this example, are determined by the slave device, e.g. the memory device 200, to allow the instruction data to be delivered at the memory device 200 and have the memory device 200 to be ready for the data transfer. During the dummy cycles, the memory device 200 prepares the designated data for data transmission to the host device 120 according to the received instruction data. For example, the device 200, once receives the "RD" command and data reading address, starts to read instructions from its shadow RAM 210. During the data phase, instructions transmitted out from the shadow RAM 210 to the SPI 140. In this example, the output instruction packages are aligned with the clock signals and 4 clock cycles are used to transmit 32 bits of instruction stored in the shadow RAM 210 for I/O bus width of 8 bits in a single transfer of each clock.

Alternatively, referring to FIG. 4B, the "command and address" phase for data reading operations on the NAND flash memory 204 includes the "PgRD" command and the "RD" command. In this example, the "PgRD" command and followed NAND flash memory page address byte are firstly transmitted in and then followed by the "RD" command and random address on the identified page of the NAND flash memory. There is a wait time between the "PgRD" and "RD" commands and it relates to the NAND flash memory page access time. As described earlier, accessing a page of the NAND flash memory, e.g., by executing the "PgRD" command, may takes longer time, e.g., 25 us or more. This is caused by the characteristics and architecture of the NAND flash memory, and is the main bottleneck of the data reading operations. Once accessed the designated page of the NAND flash memory, the "RD" command is executed to read data stored at a random address on the page of the NAND flash memory. Similarly to instruction reading on the shadow SRAM, the output data packages from the NAND flash memory are aligned with the clock signals and, in this example, 32 bits data stored in the NAND flash memory are transmitted out.

In reality, the designated data may be stored on multiple pages of the NAND flash memory 204. The memory device 200, with this configuration, has to repeat transferring the "PgRD" command multiple times to access multiple pages of the NAND flash memory and the "RD" command to access random address on corresponding page of the NAND flash memory. As the bottle neck of data reading operations in the memory device 200, the data reading commands including "PgRD" and "RD" descripted in FIG. 4B are not favor to a random access application, e.g., XiP operations. Additionally, additional data reading commands dedicating to various memories of the device 200 may bring operation redundancy and complexity to the user.

An indicator signal is used to indicate whether data is valid during variable wait cycles in the waveform. The indicator signal can be a standalone signal or a composite signal. A variety of signals can be used for the indicator signal, including a data strobe signal (DS), a standalone ready/busy signal, an interrupt signal, etc. The indicator signal can use an existing signal line, e.g., a signal line that would otherwise be present in the device for another purpose, or the indicator signal can have a dedicated signal line.

Figure 5:
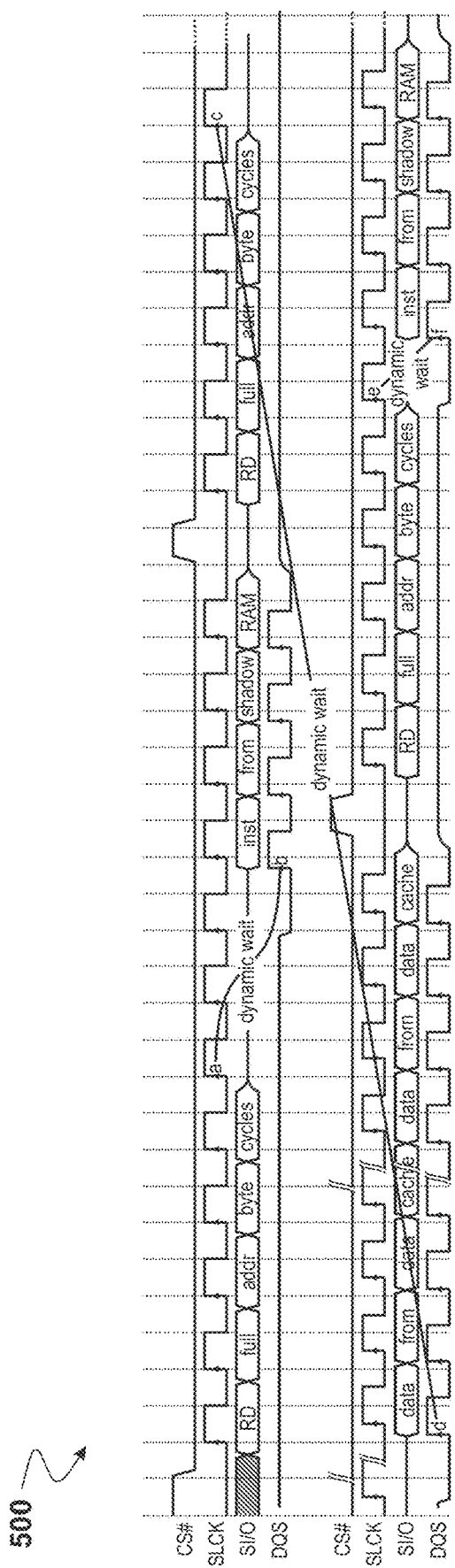
FIG. 5 illustrates timing diagrams of data reading operations in the electronic device system 100 in another embodiment.

FIG. 5 describes timing diagrams of example data reading operations in the memory device 200 according to an embodiment of the application. In this example, a unified data reading command "RD" is used for data reading operations in the memory device 200 including instructions reading from the shadow RAM 210 and reading from the NAND flash memory 204. This configuration uses a data strobe (DS) signal, which is driven by the memory device 200 and transferred through the SPI bus 140 to the host device 120, to indicate whether data is valid during variable wait cycles in the waveform. With this configuration, for data reading on multiple pages of the NAND flash memory 204, continuous data reading will load a next page of the NAND flash memory to data cache automatically without issuing additional page access commands. As shown in FIG. 5, the memory access time is related to the waiting period of the waveform, specifically the DS signal status changing. In this example, the waiting period is configurable by the memory device 200, particularly the memories of the memory device 200, according to the setting of the DS signal.

The example waveform of FIG. 5 includes three data reading operations for XiP in the electronic device system 100: 1) instruction reading on the shadow RAM with longer waiting cycles; 2) data reading on the NAND flash memory; and 3) instructions reading on the shadow RAM with shorter waiting cycles.

Referring back to the FIG. 5, after the chip select signal CS # is issued, the unified "RD" command and a full address byte, e.g., a 32-bit address, are transmitted into the device 200 using the SI/O pin for instructions reading on the shadow RAM. During this command & address phase, the DS signal is in a tri-state. Once the command and address byte transmission is completed, the waiting period starts for preparing the designated instructions for data transmission to the host device. In this example, the instruction fetched by the host device 120 and stored in the shadow RAM 210 is reserved, and the length of the waiting period is determined by the DS signal. For example, when the shadow RAM is ready for instruction transmission, the DS signal is driven by the memory device 200 changing from the tri-state to a logic low state. The waiting period ends when the memory device 200 outputs an alternating DS signal, e.g., at a raising edge of the DS signal. The output instruction data packages are aligned with the alternating DS signal cycles, for example, with raising edges of the DS signal cycles. When the instruction data transmission completes, the DS signal is being converted back to the tri-state, indicating the shadow RAM is not ready for data transmission.

The data reading operations on the NAND flash memory are similar to that described above. Once the second "RD" command and full address byte are transmitted in, a waiting period starts to prepare designated data transmission from the NAND flash memory to the host device through the SPI bus 140. The DS signal is kept in the tri-state indicating the NAND flash memory is in preparation and not ready for data transmission. When the NAND flash memory is ready, the DS signal is driven from the tri-state to a logic low state, indicating the NAND flash is ready for data transmission to the host device. The output data packets from the NAND flash memory are aligned with the alternating DS signals, for example, raising edges of the alternating DS signals. In this example, the data packets output continuous until the data reading address reaches the end of the NAND flash memory page. For data that is stored on multiple pages of the NAND flash memory 116, the data reading operations access the next page of the NAND flash memory while driving the DS signal back to the logic low state. Once the NAND flash memory is ready to transfer data from the next page, the DS signal will be driven back to alternating to end the waiting period. The memory device 200 resumes transmitting data from the next page of the NAND flash memory while alternating the DS signal. In this example, the memory device 200 continuously reads a next page of the NAND flash memory to the data cache 208 without issuing any "PgRD" command to access any specific NAND flash memory pages.

The third instructions reading operation on the shadow RAM starts with inserting the third "RD" command in the waveform of FIG. 5. In this example, the waiting period between the instruction insertion and data transmission is shorter than that of the first instructions reading operation shown at the beginning of the wave form. It is provided here as an example to show that the waiting period as well as the memory access time is not fixable, but configurable according to controlling of the DS signal.

In another implementation, an enhancement mode may be implemented to further improve read performance without issuing subsequent RD command after a first RD command issued with an indicator to conduct memory device 110 or 200 for commands afterwards.

For example, the memory device 110 may perform cache read sequential operation for throughput enhancement by using an internal cache buffer. That allows the consecutive pages to be read-out without giving next memory page address, which reduces the latency time from tR to tRCBSY between the memory pages or blocks. While the data is read out on one page, the data of next page can be read into the cache buffer.

In some implementations, the enhancement mode may be configured in advance and impose enhancement mode on device at power-on.

What is claimed is:

1. A device comprising:
    a NAND flash memory configured to store data;
    a non-volatile register configured to record source addresses for data transition;
    a shadow RAM connected with the NAND flash memory through a data cache from the NAND flash memory to the shadow RAM; and
    a control circuit connected with the NAND flash memory and the shadow RAM, wherein the control circuit is configured to:
        determine, based on power on of an electronic device, a location of first data in a NAND flash memory of the electronic device, and
        transmit the first data to a shadow RAM of the electronic device.

2. The device of claim 1, further comprising:
    a mapping table connected with the control circuit, wherein the mapping table comprises a NAND flash memory address of the first data and address information of the shadow RAM, and wherein the control circuit is configured to:
        verify an input NAND flash memory address sent from a host device of an electronic system,
        determine whether the input NAND flash memory address corresponds to the NAND flash memory address of the first data, and
        based on the determination, redirect data reading operations in the shadow RAM or read the NAND flash memory.

3. The device of claim 1, further comprising a data cache connected with the NAND flash memory and the shadow RAM, and configured to temporarily store data output from the NAND flash memory.

4. The device of claim 3, further comprising an error correcting code (ECC) engine connected with the shadow RAM and the data cache, wherein the ECC engine is configured to:
    read the first data temporarily stored in the data cache,
    perform error correction on the first data in the ECC engine, and
    send, based on completing of the error correction, corrected first data back to the data cache.

5. The device of claim 1, further comprising a serial peripheral interface (SPI) bus that includes at least one of data I/O lines, a clock signal line, or chip select signal lines for communications between a host device and components in the electronic device.

6. The device of claim 5, wherein the control circuit is configured to indicate whether data is valid for transmission during variable waiting periods by an indicator signal.

7. The device of claim 6, wherein the indicator signal is one of a standalone signal, a composite signal, or an existing interrupt signal.

8. The device of claim 6, wherein the indicator signal is an existing datastrobe (DS) signal or a DS signal being driven from a tri-state to a logic low state when the NAND flash memory is ready for data transmission,
    wherein a length of the variable waiting periods is configurable by controlling the DS signal, and
    wherein data output from the NAND flash memory are aligned with the DS signal.

9. The device of claim 5, wherein the first data is an executable program executed by the host device, and after a system boot of the electronic device starts, instructions in the first data are fetched in an eXecution in Place (XiP) mode from the shadow RAM, and
    wherein the control circuit is configured to:
        transmit, based on the instructions, second data from the NAND flash memory to a system memory of the electronic device; and
        execute the transmitted second data in the system memory,
        wherein the second data is an application firmware code.

10. The device of claim 9, wherein the control circuit is configured to transmit the second data by
    accessing a page of the NAND flash memory,
    reading the second data by random accessing the page of the NAND flash memory at a designated address,
    transmitting the second data by outputting the second data to a data cache through a page buffer of the NAND flash memory, and
    transmitting the second data from the data cache to the system memory.

11. The device of claim 5, wherein the control circuit is configured to transmit the first data by
    accessing a page of the NAND flash memory,
    reading the first data by random accessing the page of the NAND flash memory at a designated address,
    transmitting the first data by outputting the first data to a data cache through a page buffer of the NAND flash memory, and
    transmitting the first data from the data cache to the shadow RAM.

12. The device of claim 5, wherein the control circuit is configured to:
    in response to the power on of the electronic device, automatically execute a flow of operations of the electronic device, wherein the operations comprise: reading the first data according to a designated address set of the first data in the NAND flash memory.

13. The device of claim 5, wherein the control circuit is configured to:
    issue a unified command for data reading operations on the shadow RAM and the NAND flash memory, or
    issue dedicated commands for data reading operations on the shadow RAM and the NAND flash memory, respectively, wherein the electronic device uses a "RD" command for random access and a "PgRD" command for accessing a page of the NAND flash memory.

14. The device of claim 13, wherein the data reading operations comprise at least one of:

executing data reading commands based on an address that contained in the first data and stored in the shadow RAM, or verifying, by a control logic of the electronic device, an input address from a host device, and determining by checking a mapping table whether the input address corresponds to data reading operations in the shadow RAM or the NAND flash memory.

15. The device of claim 1, wherein the device is configured to be a serial NAND flash.

* * * * *